United States Patent
Yang et al.

(10) Patent No.: US 7,613,868 B2
(45) Date of Patent: Nov. 3, 2009

(54) METHOD AND SYSTEM FOR OPTIMIZING THE NUMBER OF WORD LINE SEGMENTS IN A SEGMENTED MRAM ARRAY

(75) Inventors: Hsu Kai (Karl) Yang, Pleasanton, CA (US); Xizeng Shi, Fremont, CA (US); Po-Kang Wang, San Jose, CA (US); Bruce Yee Yang, Pleasanton, CA (US)

(73) Assignee: Headway Technologies, Inc., Milpitas, CA (US)

( * ) Notice: Subject to any disclaimer, the term of this patent is extended or adjusted under 35 U.S.C. 154(b) by 372 days.

(21) Appl. No.: 10/865,717

(22) Filed: Jun. 9, 2004

(65) Prior Publication Data
US 2005/0276100 A1 Dec. 15, 2005

(51) Int. Cl.
*G06F 13/16* (2006.01)
*G11C 11/15* (2006.01)
(52) U.S. Cl. .................. 711/101; 711/103; 365/171
(58) Field of Classification Search ............... 365/200, 365/158, 171, 211; 257/202; 711/103
See application file for complete search history.

(56) References Cited
U.S. PATENT DOCUMENTS

| | | | |
|---|---|---|---|
| 4,763,305 A | 8/1988 | Kuo ............................ 365/158 |
| 5,214,777 A * | 5/1993 | Curry, Jr. .................... 711/155 |
| 6,195,290 B1 | 2/2001 | Dallabora et al. ....... 365/185.19 |
| 6,335,890 B1 | 1/2002 | Reohr et al. ................. 365/207 |
| 6,515,904 B2 | 2/2003 | Moore et al. ........... 365/185.19 |
| 6,525,978 B2 | 2/2003 | Weber et al. ............. 365/225.5 |
| 6,574,145 B2 | 6/2003 | Kleveland et al. ...... 365/185.22 |
| 6,667,899 B1 * | 12/2003 | Subramanian et al. ...... 365/158 |
| 6,693,824 B2 | 2/2004 | Nahas et al. ........... 365/185.22 |
| 2002/0176272 A1* | 11/2002 | DeBrosse et al. ............. 365/97 |
| 2003/0067013 A1 | 4/2003 | Ichihara et al. ............. 257/200 |
| 2005/0114588 A1* | 5/2005 | Lucker et al. ............... 711/103 |

* cited by examiner

*Primary Examiner*—Reginald G Bragdon
*Assistant Examiner*—Kenneth M Lo
(74) *Attorney, Agent, or Firm*—Saile Ackerman LLC; Stephen B. Ackerman

(57) ABSTRACT

A method and system for programming and reading a magnetic memory is disclosed. The magnetic memory includes a plurality of selectable word line segments and a plurality of magnetic storage cells corresponding to each word line segment. The method and system include reading the magnetic storage cells corresponding to a word line segment to determine a state of each magnetic storage cell. The method and system also include writing data to a portion of the magnetic cells corresponding to the word line segment after the reading. The method and system also include rewriting the state to each of a remaining portion of the magnetic storage cells corresponding to the word line segments at substantially the same time as the portion of the magnetic cells are written.

10 Claims, 4 Drawing Sheets

US 7,613,868 B2

METHOD AND SYSTEM FOR OPTIMIZING THE NUMBER OF WORD LINE SEGMENTS IN A SEGMENTED MRAM ARRAY

FIELD OF THE INVENTION

The present invention relates to magnetic memories, and more particularly to a method and system for increasing the number of bits associated with a word line segment.

BACKGROUND OF THE INVENTION

Thin-film magnetic random access memories (MRAM) are of interest because of their potential application to nonvolatile and volatile memories. In a conventional MRAM, the magnetic storage cell typically includes a magnetic tunneling junction (MTJ) stack having a free layer, an insulating tunneling barrier layer, and a pinned layer. Use of a conventional MTJ stack makes it possible to design an MRAM cell with high integration density, high speed, low read power, and soft error rate (SER) immunity.

A conventional MRAM also includes bit lines and word lines, which are generally orthogonal. Note that the names of the conventional conductive lines are interchangeable. Other names, such as row line, column line, digit line, and data line, may also be used. The magnetic storage cells are typically located at the intersections of bit lines and word lines. In order to program a particular magnetic storage cell, write currents are driven through both the word line and the bit line associated with a particular magnetic storage cell. A current in only one of the word line or bit line is insufficient to write to the cell. However, in combination, the current provide a sufficient magnetic field to program the MTJ stack as desired.

Although such a conventional MRAM functions, one of ordinary skill in the art will readily recognize that such a conventional MRAM may inadvertently write to nearby cells. Consequently, conventional word lines may be segmented. In such a conventional MRAM, a conventional global word line is coupled through a switch, such as a transistor, to each word line segment. A number of magnetic storage cells, and thus a number of bits, are associated with each segment. As discussed above, a bit line is orthogonal to the segment at each magnetic storage cell. Typically, eight or sixteen bits are associated with each segment in a conventional MRAM having segmented word lines. In a conventional MRAM having segmented word lines, a programming current is provided only to a particular segment of the word line during writing. As a result, the possibility of inadvertently writing to cells not associated with the segment is substantially reduced.

For example, FIG. 1 depicts a conventional method 10 for writing to magnetic storage cells associated with a particular segment. A conventional write current, $I_1$, is provided to the word line segment, via step 12. In general, step 12 is performed by turning on the transistor associated with the word line segment so that current flowing through a global word line flows through the selected word line segment. Thus, the remaining word line segments do not carry a current, reducing the possibility that MTJ stacks associated with these word line segments will be inadvertently written. A second write current, $I_2$, is provided to the conventional bit lines associated with the word line segment being programmed, via step 14. The combination of the currents in the word line and bit line are sufficient to program the desired magnetic storage cells associated with the word line.

Although the above conventional MTJ stack can be written using the conventional method 10, one of ordinary skill in the art will readily recognize that use of the segmented word lines results in a large overhead for the conventional MRAM. FIG. 2 depicts an asteroid chart 50 for MTJ stacks in a conventional MRAM. The margin to ensure programming of bits within the conventional MRAM is shown as $I_M$. The safety margin within which other magnetic storage cells along the bit line will not be disturbed is shown as $I_S$. In general, the current in the word line segment, $I_1$, provided in step 12 is at point a in the chart 50. The current provided in the bit line, $I_2$, in step 14 is shown at either point b or point c in the chart 50. Because of this biasing, it is still possible that other memory cells associated with the same word line segment are inadvertently written in the conventional method 10. In order to reduce this possibility, the number of magnetic storage cells associated with a particular word line segment is small. As discussed above, therefore, conventional MRAM are typically organized based on eight bits or sixteen bits. Thus, when a write operation is performed using the method 10, all the bits associated with a particular word line segment are written in step 14. The MRAM uses a selection transistor for each word line segment. The size of the transistor used in selecting the word line segment is a significant overhead for the number of bits (eight or sixteen) associated with a word line segment. Consequently, there are still significant drawbacks to the use of a conventional MRAM utilizing conventional segmented word lines.

Accordingly, what is needed is a system and method for providing a lower overhead MRAM that is less likely to inadvertently write to nearby magnetic storage cells. The present invention addresses such a need.

SUMMARY OF THE INVENTION

The present invention provides a method and system for programming and reading a magnetic memory. The magnetic memory includes a plurality of word line segments and a plurality of magnetic storage cells corresponding to each of the plurality of word line segments. Each of the plurality of word line segments is selectable. The method and system comprise reading the plurality of magnetic storage cells corresponding to a word line segment of the plurality of word line segments to determine a state of each of the plurality of magnetic storage cells. In one aspect the method and system also comprise utilizing at least one storage for storing a state of each of the plurality of magnetic storage cells determined during a read operation made during a write operation. The method and system also comprise writing data to a portion of the plurality of magnetic cells corresponding to the word line segment after the reading. The method and system also comprise rewriting the state to each of a remaining portion of the plurality of magnetic storage cells corresponding to the word line segment at substantially the same time as the portion of the plurality of magnetic cells are written.

According to the system and method disclosed herein, the present invention provides a method for optimizing the number of bits associated with a word line segment.

DETAILED DESCRIPTION OF THE INVENTION

The present invention relates to an improvement in magnetic memories. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for programming and reading a magnetic memory. The magnetic memory includes a plurality of word line segments and a plurality of magnetic storage cells corresponding to each of the plurality of word line segments. Each of the plurality of word line segments is selectable. The method and system comprise reading the plurality of magnetic storage cells corresponding to a word line segment of the plurality of word line segments to determine a state of each of the plurality of magnetic storage cells. In one aspect the method and system also comprise utilizing at least one storage for storing a state of each of the plurality of magnetic storage cells determined during a read operation made during a write operation. The method and system also comprise writing data to a portion of the plurality of magnetic cells corresponding to the word line segment after the reading. The method and system also comprise rewriting the state to each of a remaining portion of the plurality of magnetic storage cells corresponding to the word line segment at substantially the same time as the portion of the plurality of magnetic cells are written.

The present invention will be described in terms of particular types of magnetic memory cells, particular materials and a particular configuration of elements. However, one of ordinary skill in the art will readily recognize that this method and system will operate effectively for other magnetic memory cells, and other materials and configurations non inconsistent with the present invention.

Figure 1:
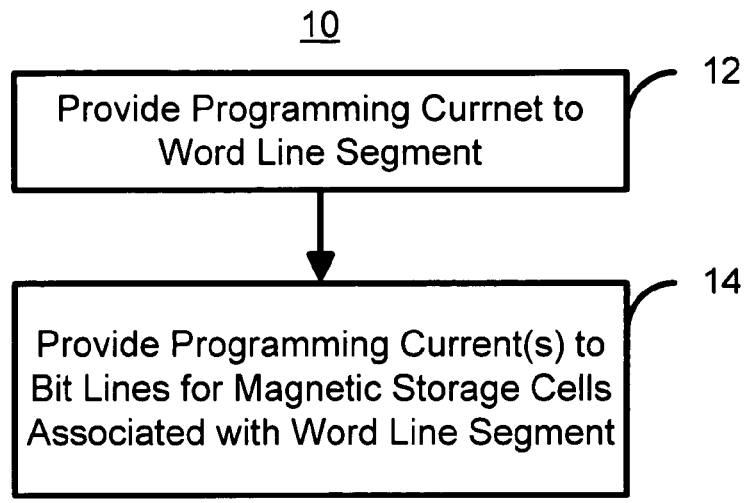
FIG. 1 is a flow chart depicting a conventional method for reading a conventional MRAM having segmented word lines.
Figure 2:
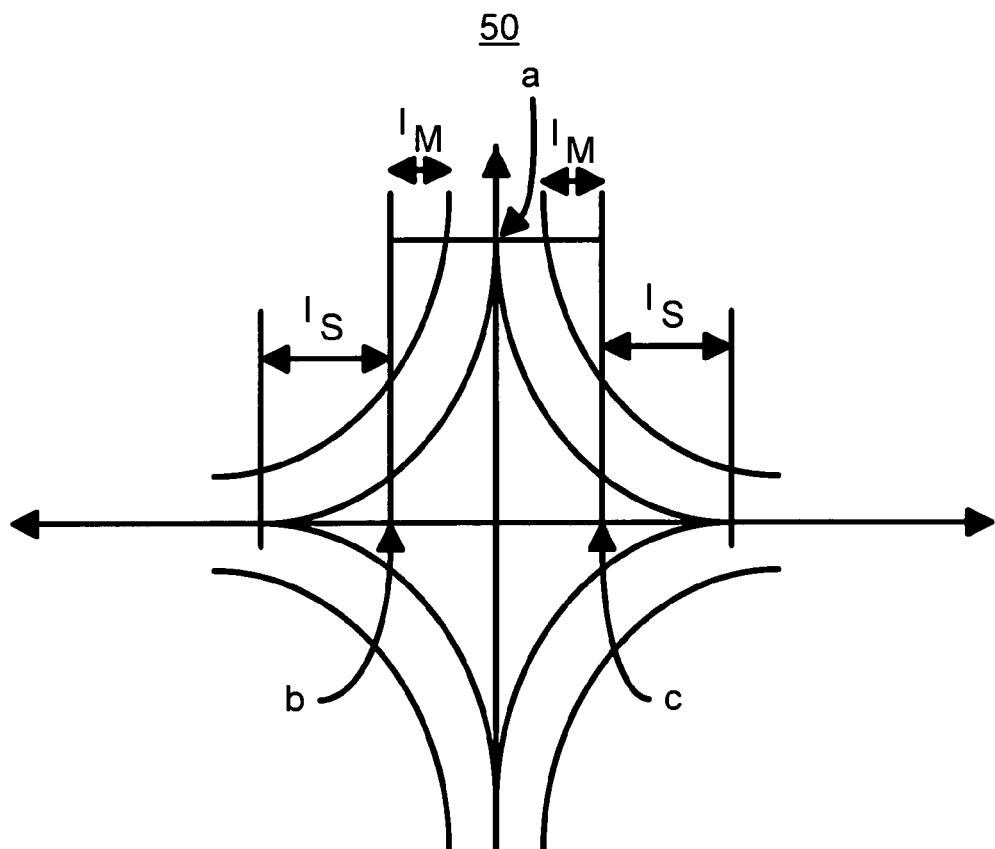
FIG. 2 is an asteroid chart for an array of magnetic tunneling junctions in a conventional MRAM.
Figure 3:
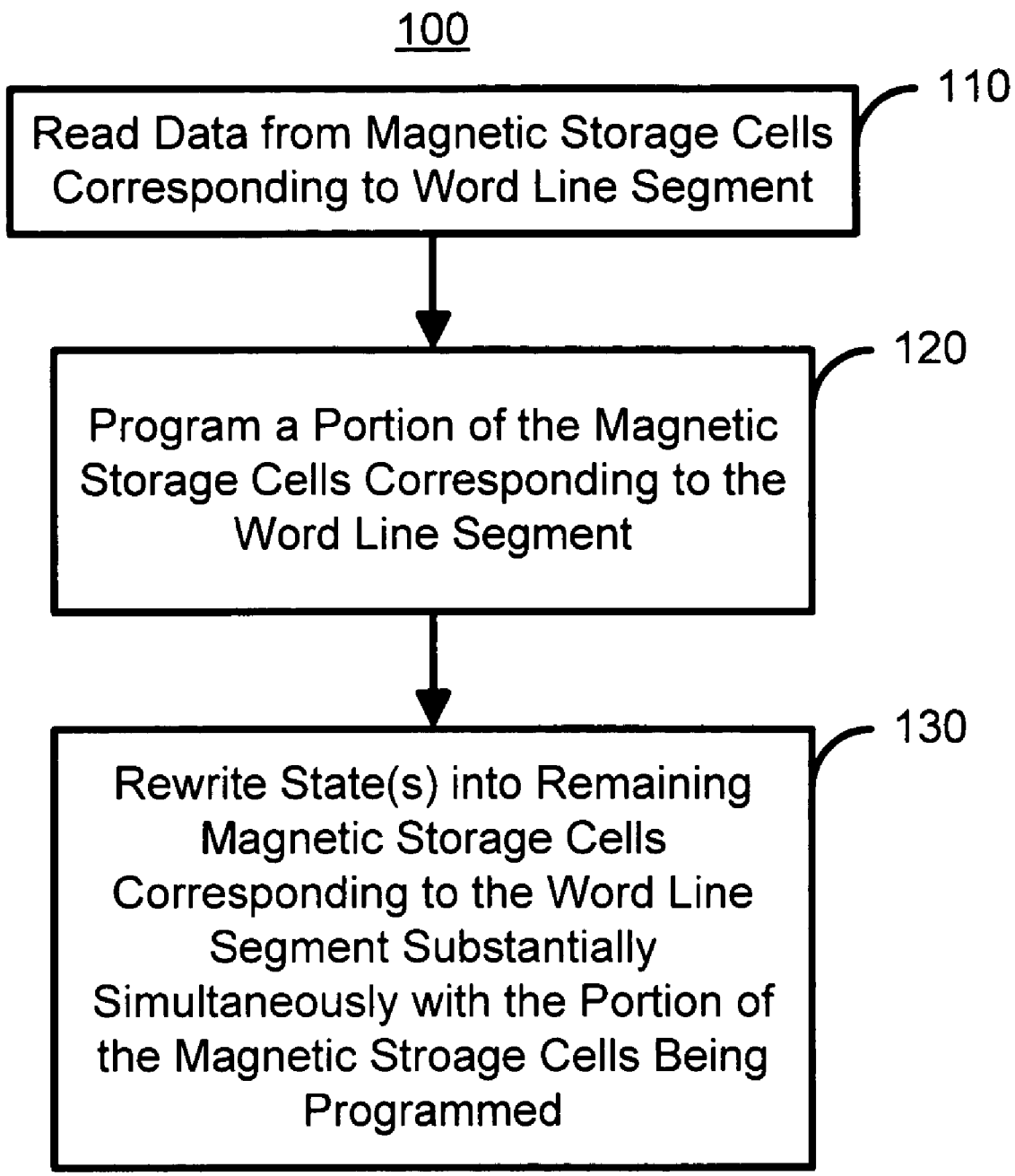
FIG. 3 is a high-level flow chart depicting one embodiment of a method in accordance with the present invention for reading an MRAM having segmented word lines.

To more particularly illustrate the method and system in accordance with the present invention, refer now to FIG. 3, depicting a high-level flow chart of one embodiment of a method 100 for programming a portion of magnetic memory. The magnetic memory includes a plurality of word line segments and a plurality of magnetic storage cells corresponding to each of the plurality of word line segments. Preferably, the magnetic storage cells reside at intersections of word line segments and bit lines, which are orthogonal to the word line segments. Each magnetic storage cell preferably includes an MTJ and an isolation transistor. However, nothing prevents the use of another type of magnetic storage cell. A larger number of magnetic storage cells and, therefore, bits, can be associated with each word line segment. In a preferred embodiment, sixteen or thirty-two bits are associated with each word line segment. Each word line segment is separately selectable, allowing the segments to be written and read separately. Although the method 100 is described in the context of writing to the storage cells associated with a particular word lines segment, one of ordinary skill in the art will readily recognize that the method 100 could be adapted to programming multiple word lines segments.

Prior to writing to any cells in a word line segment being programmed, the magnetic storage cells corresponding to the word line segment are read, via step 110. Preferably, step 110 includes reading all of the storage cells associated with the word line segment to determine a state of each of the magnetic storage cells. In an alternate embodiment, those storage cells not scheduled to be programmed are read in step 110. In a preferred embodiment, step 110 also includes storing the result of the read operation, preferably in sense amplifiers coupled with the word line segment.

After the read operation is performed, new data are written to a portion of the magnetic cells corresponding to the word line segment, via step 120. The portion of the magnetic storage cells is those target cells scheduled to be written. In one embodiment, step 120 writes a byte of data. Thus, the states of a portion of the magnetic storage cells may be changed in step 120. Step 120 is generally performed by providing a write current, $I_1$, to the word line segment and providing a second write current, $I_2$, to the bit lines associated with those magnetic storage cells being programmed. In general, the write current is provided by turning on the transistor associated with the word line segment so that current flowing through a global word line flows through the selected word line segment. The data previously stored in the remaining cells are rewritten at substantially the same time as the new data are programmed in step 120, via step 130. Thus, using step 130, the previous states determined in step 110 are rewritten to each remaining storage cell that was not programmed in step 120 at substantially simultaneously as the data are programmed in step 120. In a preferred embodiment, the remaining twenty-four bits are, therefore, rewritten in step 130. Also in a preferred embodiment, steps 120 and 130 are performed together into a single step, for example by using the respective bit line drivers (not shown) to drive the appropriate currents for both the new data being written and the previous data being rewritten in the bit lines associated with the word line segment. Thus, the appropriate current is provided to all of the bit lines associated with a word line segment in steps 120 and 130. Using step 120 and 130, therefore, the new data and the previously stored data are substantially simultaneously written to all of the cells associated with a particular word line segment.

Using the method 100, only a portion of the magnetic storage cells associated with a particular word lines segment can be programmed. Because the data for the cells not being written are rewritten in step 130 along with the new data being programmed, any danger of overwriting or randomizing the states of these cells is obviated. Consequently, a larger number of storage cells may be associated with a particular word line segment and a particular selection transistor. The overhead for the word line segment is thereby reduced.

Figure 4A:
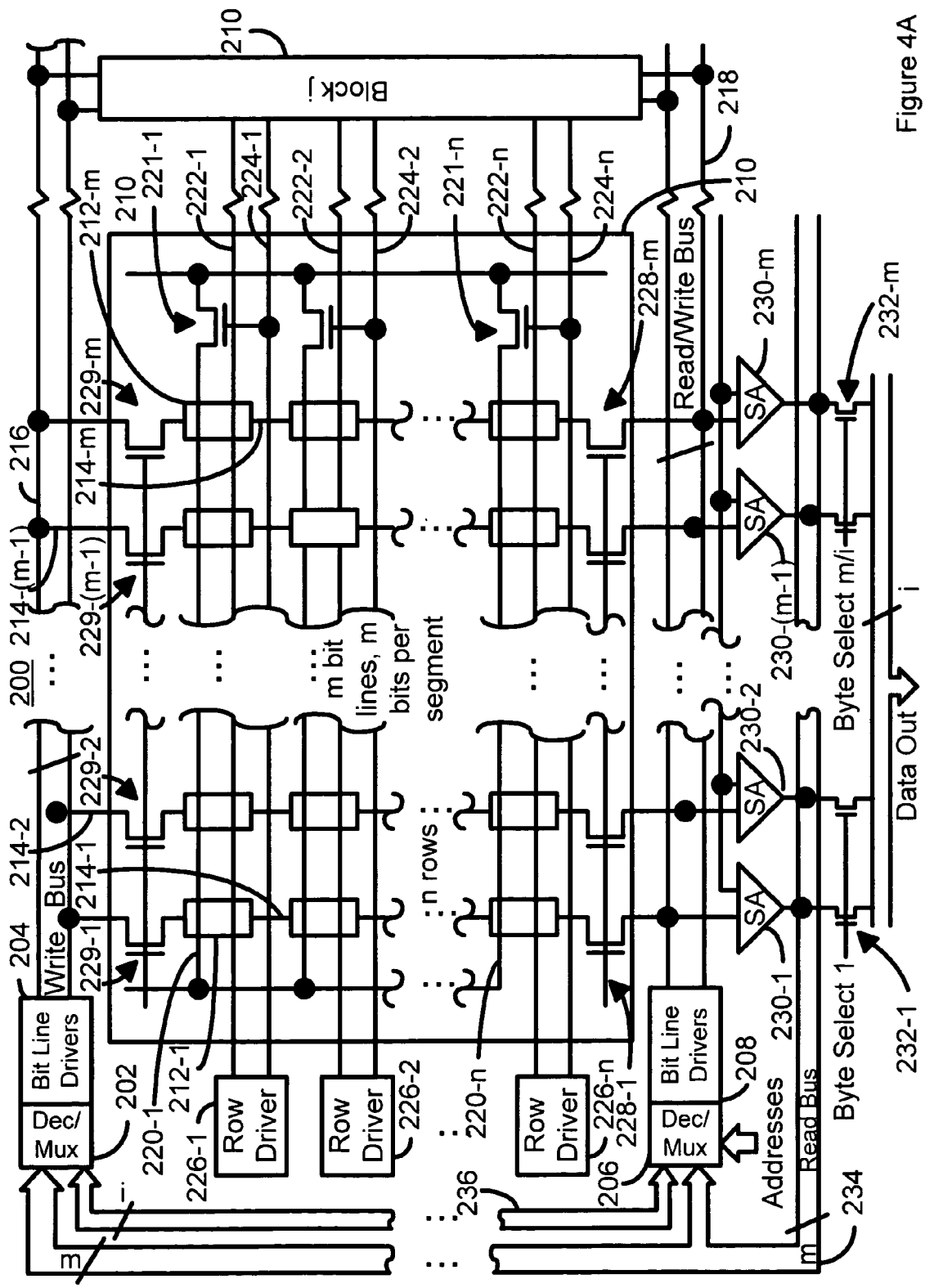
FIG. 4A is a block diagram depicting an embodiment of a magnetic memory in accordance with the present invention that has an improved number of bits associated with a word line segment.
Figure 4B:
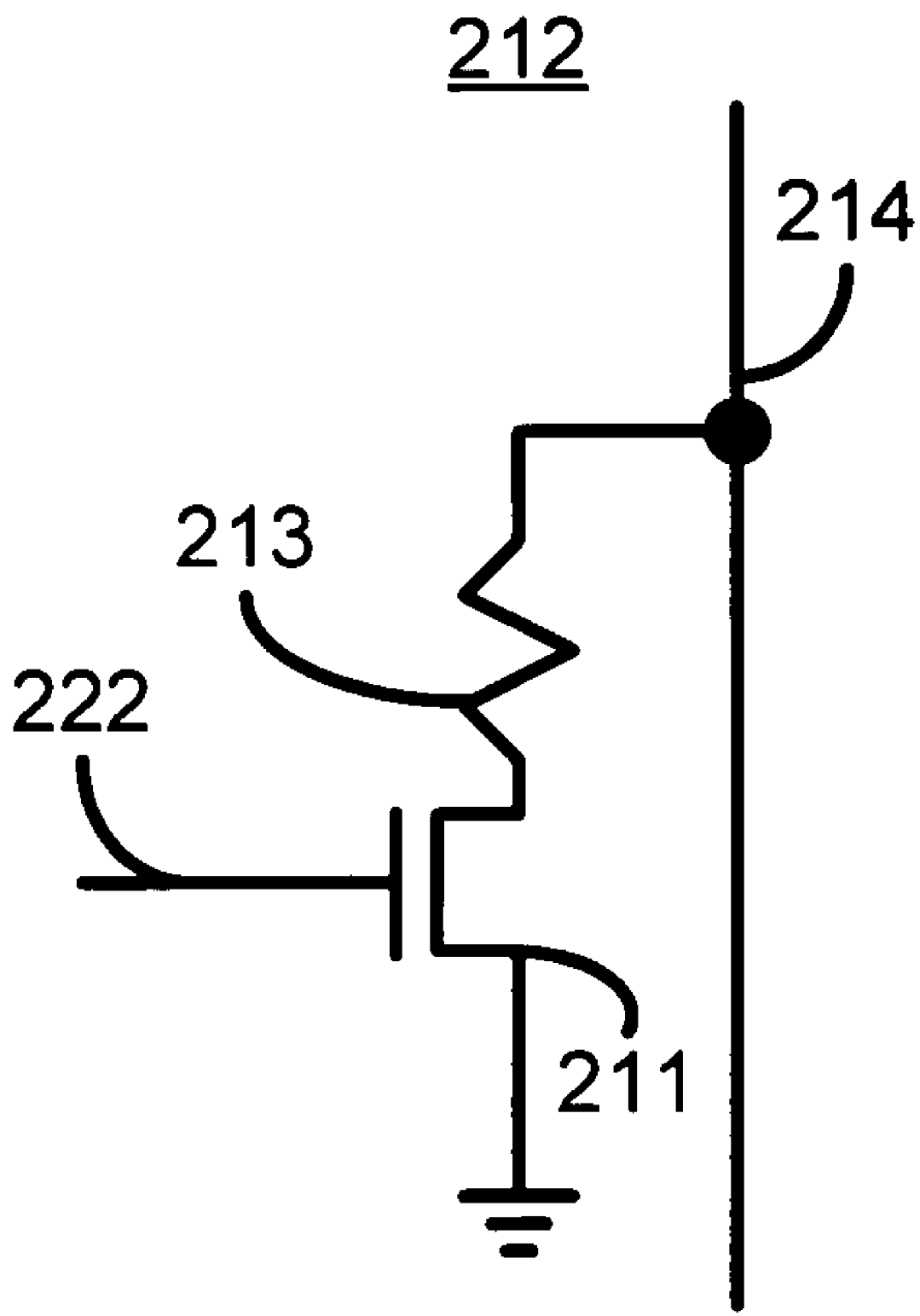
FIG. 4B depicts one embodiment of a magnetic storage cell used in the magnetic memory in accordance with the present invention.

FIG. 4A is a block diagram depicting a first embodiment of a magnetic memory 200 in accordance with the present invention that has an improved number of bits associated with a word line segment. The magnetic memory 200 is preferably used in conjunction with the method 100. The magnetic memory 200 is shown as including blocks 210, each of which is preferably identical. Each block corresponds to a set of word line segments 220-1 through 220-n. As shown in FIG. 4A, there are n word line segments and m bit lines per block. Consequently, each block 210 includes m×n storage cells. In a preferred embodiment, m is thirty two. The storage cells 212-1 through 212-m are associated with each word line segment 220-1 through 220-n. FIG. 4B is a diagram of one embodiment of a storage cell 212-1 through 212-m used in the memory 200. Referring to FIGS. 4A and 4B, each magnetic storage cell 212-1 through 212-m is preferably composed of an isolation transistor 211 and a MTJ stack 213. However, in an alternate embodiment, another type of memory cell such as a cross point cell could be used. In addition, read word lines 222-1 through 222-n and write word lines 224-1 through 224-n are associated with the blocks 210 and are selected using row driver 226-1 through 226-n, respectively. The word lines segments 220-1 through 220-n are activated using word line select transistors 221-1 through 221-n, respectively.

Also depicted are write bus 216, read/write bus 218, and read bus 234. The write bus 216 is capable of carrying data for writing to all of the cells 212-1 through 212-m associated with a particular word line segment 220-1 through 220-n. The read/write bus 218 is preferably capable of carrying data corresponding to all of the magnetic cells 212-1 through 212-m. The read bus 234 is preferably capable of carrying data from all of the sense amplifiers 230-1 through 230-m. Thus, the write bus 216, the read/write bus 218, and the read bus 234 are preferably thirty-two buses.

The magnetic memory 200 also includes storage, preferably in the form of sense amplifiers 230-1 through 230-m. The bit lines 214-1 through 214-m are coupled to the sense amplifiers 230-1 through 230-m, respectively, via page select transistors 228 and read/write bus 218. The cells 212 to be read are preferably selected using byte select transistors 232-1 through 232-m. The pages are selected using page select transistors 228-1 through 228-m and 229-1 through 229-m.

The magnetic memory 200 also includes two decoder/multiplexers 202 and 206 and two bit line drivers 204 and 208, respectively. The decoder/multiplexers 202 and 206 read data from the appropriate sense amplifiers 230-1 through 230-m. In particular, the decoder/multiplexers 202 and 206 receive data from all of the sense amplifiers 230-1 through 230-m. The decoder/multiplexers 202 and 206 select data for, or the states of, those storage cells 212-1 through 212-m that are not being programmed with new information. Using address information, the decoder/multiplexers 202 and 26 select the proper location in the word line segment 220-1 through 220-n to rewrite this data. New data being written is provided by the Data In Bus 236. In a preferred embodiment, two sets of decoder/multiplexer 202 and 206 and bit line driver 204 and 208, respectively, combinations are used in order to be capable of driving bidirectional currents in the bit lines 214-1 through 214-m.

Referring to FIGS. 3, 4A and 4B, in operation, the memory 200 is used in conjunction with the method 100. For clarity, operation of the memory 200 is described in the context of a portion of the first word line segment 220-1 being programmed. The magnetic storage cells 212-1 through 212-m associated with the word line segment 220-1 are read in step 110. In order to do so, the read word line 222-1 is activated, the word line segment 220-1 is selected, and the states are read from the bit lines 214-1 through 214-m. The states of the magnetic storage cells 212-1 through 212-m are provided via the read/write buses 218 and stored in the sense amplifiers 230-1 through 230-m, respectively. Data are written to portion of the magnetic storage cells 212-1 through 212-m in step 120. In the memory 200 shown, the number of cells written in step 120 is i. Preferably, i is eight, so that data are provided to eight of the magnetic storage cells 212-1 through 212-m (e.g. one byte). For example, magnetic storage cells 212-1 through 212-8 (not explicitly shown) might be written in step 120. Furthermore, as the data are programmed to storage cells 212-1 and 212-8, the states previously stored in the sense amplifiers 230-9 through 230-m corresponding to the remaining portion of the magnetic storage cells 212-9 through 212-m are rewritten to the remaining portion of the magnetic storage cells 212-9 through 212-m in step 130. This rewriting is accomplished by providing the contents of the sense amplifiers 230-1 through 230-m to the decoders 202 and 206 and bit line drivers 208 and 204 via buses 234. Address selection information then determines the remaining magnetic storage cells that are rewritten and, therefore, the lines which are to be driven to rewrite the data. The data being rewritten are provided to the appropriate lines via bit line drivers 204 or 208 along with the new data being written. New data being written were obtained from the Data In Bus 236. Thus, in the MRAM 200 depicted in FIG. 4A, steps 120 and 130 are merged. In the example above, the states in sense amplifiers 230-9 (not explicitly shown) through 230-m are rewritten to the magnetic storage cells 212-9 through 212-m at the same time as new data are programmed in storage cells 212-1 through 212-8.

Thus, the magnetic memory 200 has a greater number of bits, preferably thirty-two, associated with each word line segment 220-1 through 220-m. In addition, because the method 100 can be used, fewer than the m bits are programmed in a single write operation. Moreover, the programming is performed without the danger of randomizing remaining magnetic storage cells. The magnetic memory 200 thus has reduced overhead.

A method and system has been disclosed for optimizing the number of bits associated with a segment of a word line. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for programming a magnetic memory, the magnetic memory formed with segmented word lines and orthogonal bit lines coupled to magnetic memory cells, each of the word line segments being selectable, wherein the magnetic memory comprises sense amplifiers, the method comprising:
   (a) selecting a word line segment of the magnetic memory and apply a current to said word line segment; then
   (b) reading existing data of each storage cell of a plurality of magnetic storage cells coupled to the word line segment to determine a state of each of the plurality of magnetic storage cells and storing the existing data into said sense amplifiers; then
   (c) receiving, at a plurality of bidirectional bit line drivers, new data for a selected portion of at least one magnetic storage cell of the plurality of magnetic storage cells coupled to the word line segment
   (d) providing, to the plurality of bidirectional bit line drivers, existing data, from said sense amplifiers, for magnetic storage cells in an unselected portion of the plurality of magnetic storage cells that are not being programmed with said new data;
   (e) writing the data of the plurality of bidirectional bit line drivers, wherein a bidirectional current is applied by the plurality of bidirectional bit line drivers to the bit lines coupled to the selected and unselected portions of the magnetic storage cells to write the selected and unselected magnetic storage cells simultaneously, whereby any danger of overwriting or randomizing the states of the unselected portion of the magnetic storage cells is obviated, thereby allowing more than sixteen magnetic memory cells to be associated with each word line segment by reducing the overhead for the word line segments.

2. The method of claim 1, wherein the magnetic memory further comprises a plurality of selection devices for selecting said word line segment.

3. The method of claim 1 wherein the plurality of magnetic storage cells comprises thirty two bits of data and wherein the reading existing data further comprises reading bits of data from thirty two magnetic storage cells.

4. The method of claim 3 wherein the rewriting of existing data unchanged by said new data comprises writing to less than thirty two bits.

5. A magnetic memory comprising:
- a plurality of word lines orthogonal to a plurality of bit lines;
- a plurality of word line segments, each of the plurality of word line segments being selectable;
- a plurality of magnetic storage cells corresponding to each of the plurality of word line segments; and
- a plurality of sense amplifiers for storing an existing data state of each of the plurality of magnetic storage cells of a selected word line segment during a read operation made prior to a write operation performed on the magnetic storage cells coupled to the selected word line segment;

said write operation further comprising:
- i) receiving, at a plurality of bidirectional bit line drivers, new data for a selected portion of at least one magnetic storage cell of the plurality of magnetic storage cells coupled to the word line segment
- ii) providing, to the plurality of bidirectional bit line drivers, existing data, from said sense amplifiers, for magnetic storage cells in an unselected portion of the plurality of magnetic storage cells that are not being programmed with said new data;
- iii) writing the data of the plurality of bidirectional bit line drivers, wherein a bidirectional current is applied by the plurality of bidirectional bit line drivers to the bit lines coupled to the selected and unselected portions of the magnetic storage cells to write the selected and unselected magnetic storage cells simultaneously, whereby any danger of overwriting or randomizing the states of the unselected portion of the magnetic storage cells is obviated thereby allowing more than sixteen magnetic memory cells to be associated with each word line segment by reducing the overhead for the word line segments.

6. The magnetic memory of claim 5
wherein each bit line of the plurality of bit lines is coupled to at least one of said plurality of sense amplifiers.

7. The magnetic memory of claim 5 wherein each of the plurality of storage amplifiers corresponds to an individual bit line of the plurality of bit lines.

8. The magnetic memory of claim 6 further comprising:
a read bus coupled between the plurality of bit lines and said plurality of sense amplifiers.

9. The magnetic memory of claim 6 further comprising:
at least one of the plurality of bidirectional bit line drivers is coupled to each of the plurality of bit lines for driving a current in the plurality of bit lines.

10. The magnetic memory of claim 9 wherein the plurality of bidirectional bit line drivers are capable of driving the current in a forward and a reverse direction in the plurality of bit lines.

* * * * *